(12) United States Patent
Lee et al.

(10) Patent No.: US 8,140,882 B2
(45) Date of Patent: *Mar. 20, 2012

(54) SERIAL BUS CLOCK FREQUENCY CALIBRATION SYSTEM AND METHOD THEREOF

(75) Inventors: Wei-te Lee, Banqiao (TW); Shin-te Yang, Taichung (TW); Yen-fah Chu, San Jose, CA (US)

(73) Assignee: Genesys Logic, Inc., Taipei (TW)

( * ) Notice: Subject to any disclaimer, the term of this patent is extended or adjusted under 35 U.S.C. 154(b) by 503 days.

This patent is subject to a terminal disclaimer.

(21) Appl. No.: 12/388,373

(22) Filed: Feb. 18, 2009

(65) Prior Publication Data

US 2010/0122106 A1 May 13, 2010

(30) Foreign Application Priority Data

Nov. 11, 2008 (TW) ................................ 97143548 A

(51) Int. Cl.
*H03D 3/24* (2006.01)

(52) U.S. Cl. ........ 713/400; 713/401; 713/500; 713/501; 713/502; 713/503; 713/600; 713/601; 375/355; 375/362; 375/371; 375/374

(58) Field of Classification Search .......... 713/400–401, 713/500–503, 600–601; 375/355, 362, 371, 375/374
See application file for complete search history.

(56) References Cited

U.S. PATENT DOCUMENTS

| 6,297,705 | B1 | 10/2001 | Williams et al. |
| 6,407,641 | B1 | 6/2002 | Williams et al. |
| 6,525,616 | B1 | 2/2003 | Williams et al. |
| 6,946,920 | B1 | 9/2005 | Williams et al. |
| 7,093,151 | B1 | 8/2006 | Williams |
| 7,453,958 | B2 | 11/2008 | Greco et al. |
| 2009/0190707 | A1* | 7/2009 | Clovis .......................... 375/376 |
| 2009/0252212 | A1* | 10/2009 | Risk et al. ..................... 375/231 |
| 2011/0016346 | A1* | 1/2011 | Lee et al. ...................... 713/503 |

FOREIGN PATENT DOCUMENTS

TW 200719154 5/2007

* cited by examiner

*Primary Examiner* — M Elamin

(74) *Attorney, Agent, or Firm* — Kirton McConkie; Evan R. Witt

(57) ABSTRACT

A serial bus clock frequency calibration system and a method thereof are disclosed herein. The system utilizes a first frequency calibration device and a second frequency calibration device both to share an oscillator as so to perform two-stage clock frequency resolution calibrations for generating different frequency-tuning ranges. This can bring an optimal frequency resolution and greatly reduce system complexity and save element cost.

24 Claims, 6 Drawing Sheets

SERIAL BUS CLOCK FREQUENCY CALIBRATION SYSTEM AND METHOD THEREOF

FIELD OF THE INVENTION

This invention relates to a serial bus clock frequency calibration system and a method thereof, and more particularly, to a serial bus clock frequency calibration system and a method thereof for raising a clock frequency resolution of data transmission between a serial bus host and a serial bus device.

BACKGROUND OF THE INVENTION

Currently, a high speed serial bus transmission architecture including such as an universal serial bus (USB) or an IEEE1394 interface is frequently used to be connected to an external peripheral apparatus. In an exemplar of a USB interface data transmission architecture, a common host utilizes a USB control chip to offer an USB port with a capability of simultaneously connecting with various peripheral apparatus, such as a keyboard, a mouse, a joystick, a card reader, a flash disk, a digital camera or a scanner etc., so as to simplify the connections among the peripheral apparatus and the host. Optimally, the USB interface can support the most amounts of up to 127 peripheral apparatus, and support a plug-and-play function which can perform a hot plugging and detect a newly-added hardware even when the power supply is powered on. Currently, the standard specification of the USB is developed to 2.0 version, which can operate in a data transmission speed of up to 480 Mbps. According to the requirement of the USB specification, the micro-frame timer range needs to be a high speed bits range from 59904 bits to 60096 bits so as to greatly raise bandwidth sufficient for accommodating more data transmission packets.

Referring to FIG. 1, a conventional USB interface data transmission architecture is shown, which includes a USB host 10 and a USB device 12 connected with each other via USB interfaces and transmitting USB signal therebetween. Since the resolution of the signal transmission frequency on the demand of the USB interfaces is very high, a USB control chip of the USB device 12 needs to employ an external crystal oscillator 14 for generating a clock frequency to be a working frequency thereof. However, the usage of the external crystal oscillator 14 costs higher, and may invoke occurrence of a frequency error problem in the working frequency in comparison with the USB signal transmitted from the USB host 10.

Furthermore referring to FIG. 2, which shows another conventional USB interface data transmission architecture disclosed in TW Patent Pub. No. 200719154 (as thereafter referred to Patent Pub. No. '154) including a USB host 20 and a USB device 22 connected with each other for transmitting USB signal therebetween. As shown in FIG. 2 of Patent Pub. No. '154, the USB device needs to additionally employ a frequency signal source 24 (referring to a reference clock generating circuit 132 disclosed in FIG. 7 of Patent Pub. No. '154) to provide a reference clock signal according to a corrected output signal. Then, a frequency synthesizer (as referring to a phase-locked loop 134 disclosed in FIG. 7 of Patent Pub. No. '154) is used to calibrate a working frequency according to the reference clock signal. However, such a conventional circuit design becomes highly complicated and costs higher. For USB transmission signal, the working frequency calibrated by the frequency signal source generated from the reference clock generating circuit still has the inaccurate frequency resolution problem.

SUMMARY OF THE INVENTION

To eliminate the aforementioned drawback, an object of the present invention is to provide a serial bus clock frequency calibration system and a method thereof, which integrate two-stage clock frequency resolution calibrations with different frequency tuning ranges, one of which firstly treats the start of frame (SOF) signal as a preliminary reference for coarsely tuning an operating clock frequency of the USB device, and the other of which treats a USB input signal as a reference clock frequency for continuously fine tuning the operating clock frequency of the USB device, and thereby achieve an optimum clock frequency resolution.

Another object of the present invention is to provide a serial bus clock frequency calibration system and a method thereof which use a first frequency calibration device and a second frequency calibration device to share the same oscillator for executing two-stage clock frequency resolution calibrations, and thereby greatly reduce system complexity and save element cost.

To achieve the aforementioned invention objects, a serial bus clock frequency calibration system according to one embodiment of the present invention is configured to receive a serial bus input signal transmitted from a serial bus host, wherein the serial bus input signal has at least one SOF periodic signal and a reference clock frequency. The system comprises an oscillator, a first frequency calibration device and a second frequency calibration device. In operation of the system, the oscillator generates different variable clock frequencies corresponding to the first frequency calibration device and the second frequency calibration device so as to perform two-stage clock frequency resolution calibrations.

The first frequency calibration device is configured to generate a first control signal to set up a first stage frequency tuning range based on the SOF periodic signal and the variable clock frequency generated from the oscillator so as to continuously tune the variable clock frequency to reach a first clock frequency conforming with the interval time defined within the periodic signal and simultaneously generate a second control signal. Substantially, the first frequency calibration device and the oscillator constitute a first-stage frequency acquisition loop to vary the variable clock frequency or maintain the variable clock frequency to the first clock frequency.

The second frequency calibration device is based on the enabling of the second control signal and the phase or edge of the reference clock frequency to generate a third control signal to set up a second frequency tuning range so as to continuously tune the variable clock frequency from the first clock frequency to reach a second clock frequency approaching the reference clock frequency. Substantially, the second frequency calibration device and the oscillator constitute a second-stage frequency acquisition loop to vary the variable clock frequency from the first clock frequency or maintain the variable clock frequency to be the second clock frequency and outputted from the oscillator, and the second-stage frequency acquisition loop is a phase lock loop or a frequency lock loop.

According to another embodiment of the present invention, the serial bus clock frequency calibration method comprises the following steps:

receiving a serial bus input signal transmitted from a serial bus host to a serial bus device, wherein the serial bus input signal has at least one SOF periodic signal and a reference clock frequency;

using a first frequency calibration device based on whether the interval time of the SOF periodic signal counted by a variable clock frequency generated from the oscillator is matched to generate a first control signal to vary the variable clock frequency or maintain the variable clock frequency to be a first clock frequency conforming with an interval time defined within the SOF periodic signal and simultaneously generating a second control signal; and using a second frequency calibration device based on enabling of the second control signal and a phase or edge difference between the reference clock frequency and the variable clock frequency calibrated from the first clock frequency and transmitted from the oscillator, generating a third control signal to vary the variable clock frequency from the first clock frequency or maintain the variable clock frequency varied from the first clock frequency and outputted from the oscillator to be a second clock frequency conforming with the reference clock frequency.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In order to make the illustration of the present invention more explicit and complete, the following description is stated with reference to FIG. 3 through FIG. 8.

Figure 1:
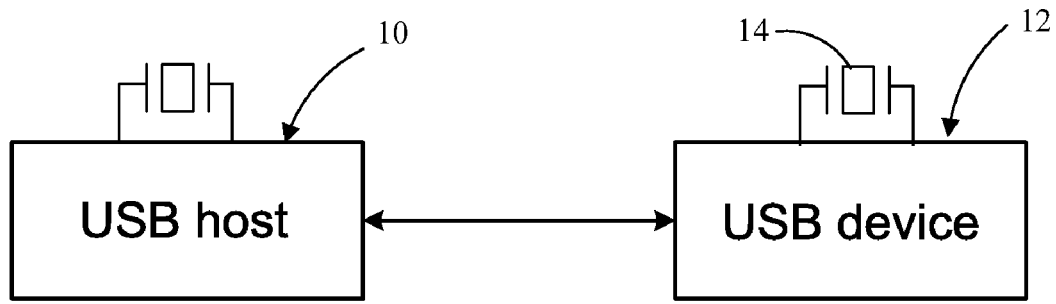
FIG. 1 is a schematic diagram showing a conventional USB interface data transmission architecture between a USB host and a USB device.
Figure 2:
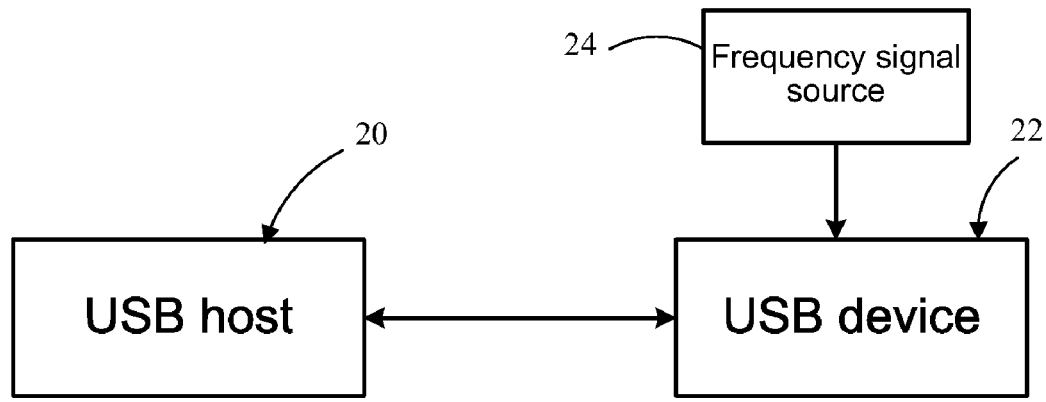
FIG. 2 is a schematic diagram showing another conventional USB interface data transmission architecture between a USB host and a USB device.
Figure 3:
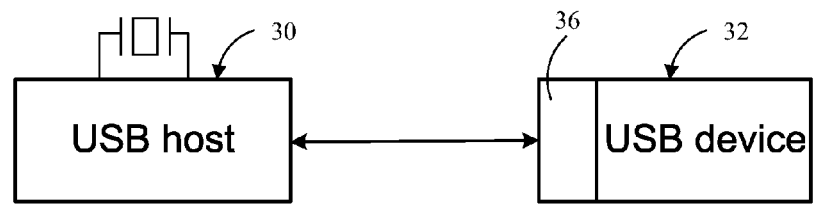
FIG. 3 is a schematic diagram showing an USB interface data transmission architecture between a USB host and a USB device according to a preferred embodiment of the present invention.

Referring to FIG. 3, a functional block diagram according to a preferred embodiment of the present invention shows a USB host 30 and a USB device 32 for performing USB interface signal transmission there between. The USB device 32 such as a USB hub includes a serial bus clock frequency calibration system 36 configured to perform two-stage clock frequency resolution calibrations with different tuning ranges, according to a USB input signal transmitted from the USB host 30 to the USB device 32. The two-stage clock frequency resolution calibrations comprise a first stage resolution calibration and a second stage resolution calibration. The first stage resolution calibration utilizes a SOF signal of the USB input signal which is a periodic signal to be a preliminary reference for coarse tuning an operation clock frequency required for the USB device 32. By following the first stage resolution calibration, the second stage resolution calibration utilizes a frequency of the USB input signal to be a reference clock frequency for continuously fine tuning the operation clock frequency of the USB device 32 to approach the frequency of the USB input signal, and thereby achieve an optimum clock frequency resolution.

Figure 4:
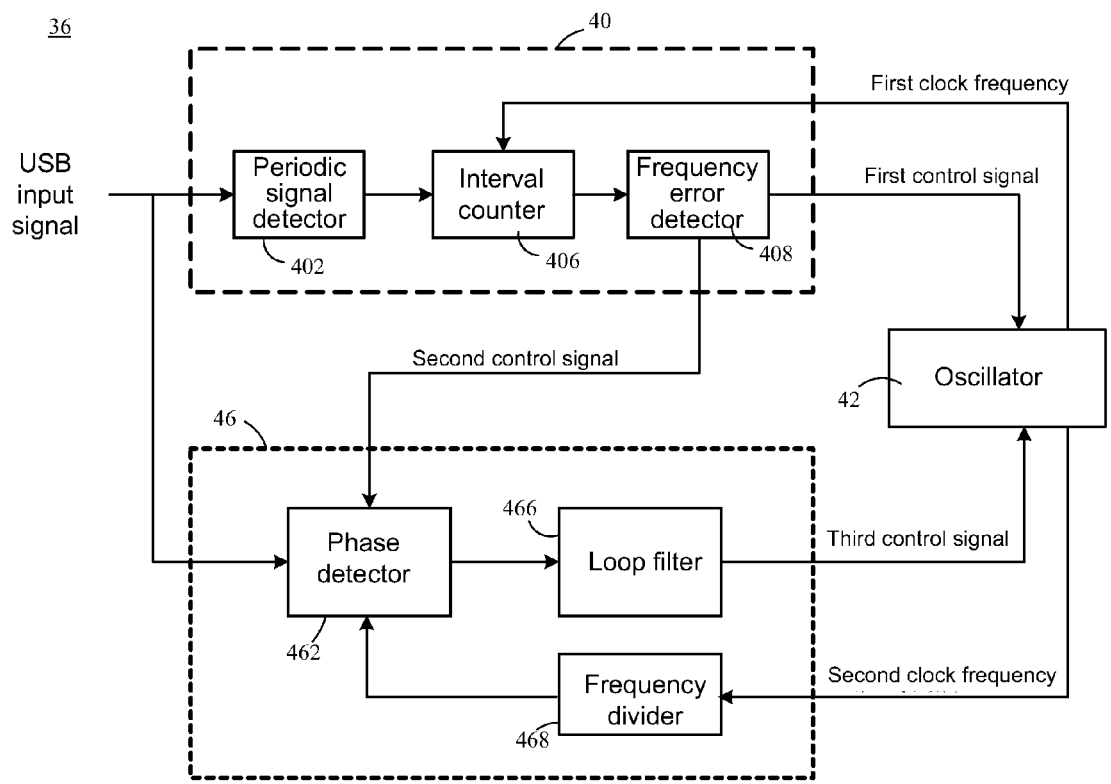
FIG. 4 is a functional block diagram showing a serial bus clock frequency calibration system according to a preferred embodiment of the present invention.

Further referring to FIG. 4, a basic architecture of the serial bus clock frequency calibration system 36 of the present invention is presented herein and primarily comprises a first frequency calibration device 40, an oscillator 42 and a second frequency calibration device 46. Upon operation of the serial bus clock frequency calibration system 36, the oscillator 42 respectfully outputs different variable clock frequencies to the first frequency calibration device 40 and the second frequency calibration device 46. Once the USB input signal is inputted to the serial bus clock frequency calibration system 36, the first frequency calibration device 40 and the second frequency calibration device 46 simultaneously receive the USB input signal to perform two-stage clock frequency resolution calibrations on the variable clock frequency outputted from the oscillator 42.

The first frequency calibration device 40 further includes a periodic signal detector 402, an interval counter 406 and a frequency error detector 408, wherein the periodic signal detector 402 is configured to detect the occurrence of the SOF periodic signal data format within the USB input signal. The interval counter 406 employs the variable clock frequency transmitted from the oscillator 42 to count the cycle numbers of single or multiple interval of the SOF periodic signal, and thereby achieve a working count value. The frequency error detector 408 compares the working count value with a predetermined goal count value of SOF interval time to determine if both of the values match or are close. According to the different comparison results, the frequency error detector 408 generates a first control signal with different levels to the oscillator 42, and simultaneously generates a second control signal with different levels to the second frequency calibration device 46. The variable clock frequency outputted from the oscillator 42 is continuously tuned by the first control signal with different level, and then the tuned variable clock frequency is transmitted back to the first frequency calibration device 40 for perform the same process as aforementioned, and so on and so forth until the variable clock frequency outputted from the oscillator 42 is tuned to reach a first clock frequency conforming with the interval time of the SOF periodic signal.

For example, when the frequency error detector 408 determines that the working count value is different to the predetermined goal count value, it means the variable clock frequency being transmitted from the oscillator 42 is larger or smaller than the interval time of the SOF periodic signal. At this time, the frequency error detector 408 changes the level of the first control signal so as to vary the variable clock frequency transmitted from the oscillator 42 and simultaneously fix one of levels of the second control signal capable of disabling the second frequency calibration device 46. Then, the varied clock frequency is transmitted back from the oscillator 42 to the first frequency calibration device 40 for the same comparing processing. On the contrary, when the frequency error detector 408 determines that the working count value is identical to the predetermined goal count value, it means that the variable clock frequency transmitted from the oscillator 42 is calibrated to reach the first clock frequency which is close to or identical to the interval time of the SOF periodic signal (i.e. the first stage resolution calibration is accomplished). At this time, the frequency error detector 408 can fix the output level of the first control signal so as to maintain the variable clock frequency transmitted from the oscillator 42 to be the first clock frequency, and simultaneously vary the output level of the second control signal to enable the second frequency calibration device 46.

Figure 5:
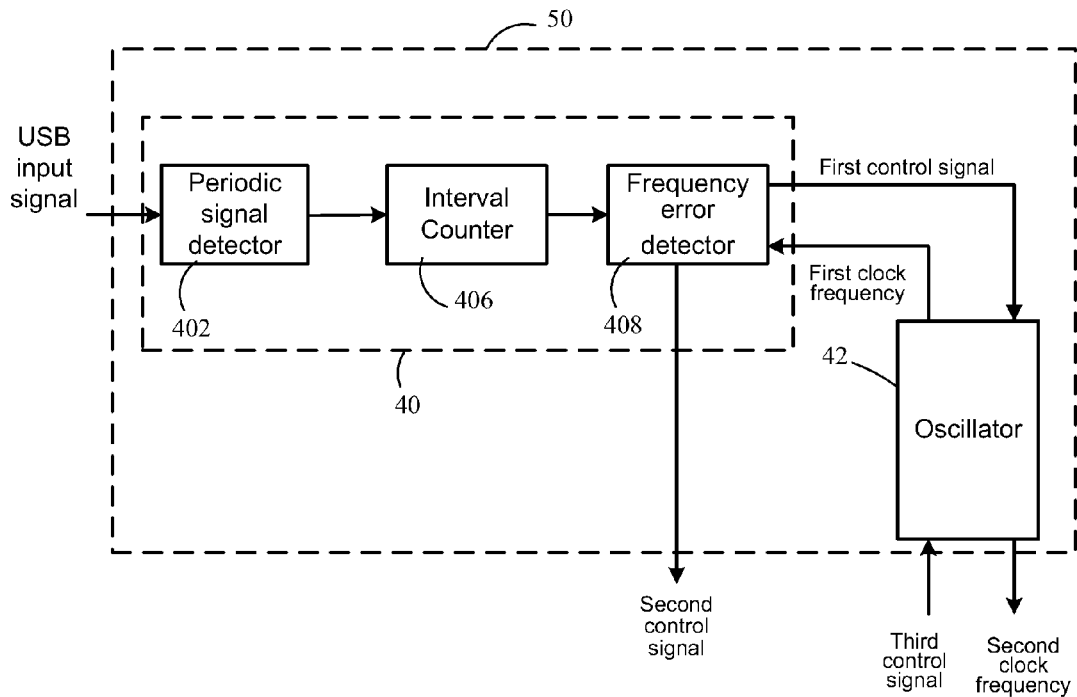
FIG. 5 is a functional block diagram showing a first-stage frequency acquisition loop of the serial bus clock frequency calibration system according to a preferred embodiment of the present invention.
Figure 6:
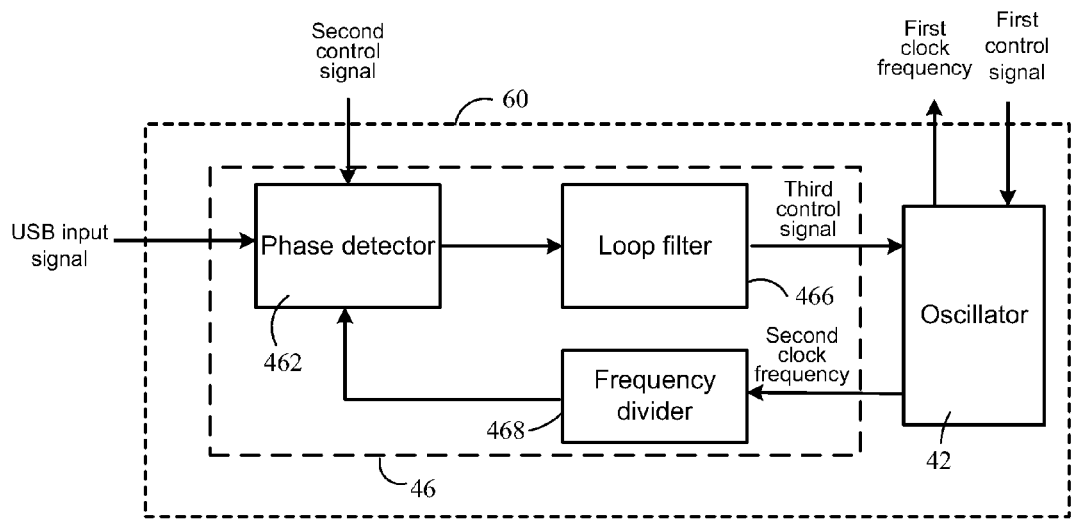
FIG. 6 is a functional block diagram showing a second-stage frequency acquisition loop of the serial bus clock frequency calibration system according to a preferred embodiment of the present invention.

Accordingly, referring to FIG. 4 and FIG. 5, the first frequency calibration device 40 and the oscillator 42 substantially constitute a first stage frequency acquisition loop 50. The first stage frequency acquisition loop 50 sets up a first frequency tuning range of the oscillator 42, according to the first control signal transmitted from the first frequency calibration device 40, so as to calibrate the variable clock frequency outputted from the oscillator 42 to reach the first clock frequency. In the present embodiment, the first control signal substantially are composed of a set of level-variable digital switch signals BCS[0]~BCS[N] (referring to FIG. 7A and FIG. 7B) which can be implemented as control parameters for the oscillator 42. Thus, when the frequency error detector 408 fixes or varies the output level of the first control signal, it means the frequency error detector 408 maintains the output level of the digital switch signals BCS[0]~BCS[N] or varies the output level of at least one of the digital switch signals so as to set up the first frequency tuning range of the oscillator 42.

Turning to FIG. 4 with respect to the present embodiment, the second frequency calibration device 46 comprises a phase detector (PD) 462 (or a frequency detector, FD), a loop filter 466 and a frequency divider 468, wherein the PD 462 is enabled by the second control signal transmitted from the first frequency calibration device 40 to treat the frequency of the USB input signal as a reference clock frequency and determine if there is a phase or edge difference between the reference clock frequency and the variable clock frequency calibrated from the first clock frequency and transmitted from the oscillator 42 (or a divided clock frequency transmitted from the frequency divider 468) is matched so that an upward indicator signal or a downward indicator signal will be generated sending to the loop filter 466, which indicates the variable clock frequency calibrated from the first clock frequency and transmitted from the oscillator 42 being ahead or lagged relative to the reference clock frequency. In the present embodiment, the loop filter 466 may be a low pass filter and is configured to accumulate the phase of the upward indicator signal or the downward indicator signal and accordingly generate a third control signal with different level so as to continuously tune the variable clock frequency from the first clock frequency to reach a second clock frequency. Then, the variable clock frequency tuned from the first clock frequency is transmitted back from the oscillator 42 to the second frequency calibration device 46 for performing the same process as aforementioned, and so on and so forth. Until the variable clock frequency outputted from oscillator 42 and tuned from the first clock frequency reaches the second clock frequency conforming with the reference clock frequency, the loop filter 466 fixes the corresponding level of the third control signal for maintaining such a variable clock frequency outputted from the oscillator 42 and tuned from the first clock frequency to be the required second clock frequency. In the present embodiment, the third control signal may be an analog voltage signal (Vc). The frequency divider 468 may be an integer divider or a fractional divider and is configured to receive the variable clock frequency transmitted from the oscillator 42 and tuned from the first clock frequency, and generate the divided clock frequency to the PD 462. In other embodiments of the present invention, the second frequency calibration device 46 may further comprise a charge pump (not shown) connected between the PD 462 and loop filter 466, depending on an actual demand, and thereby generate a current to charge the loop filter 466 according to the upward indicator signal or the downward indicator signal of the PD 462.

As described above, referring to FIG. 4 and FIG. 6, the second frequency calibration device 46 and the oscillator 42 substantially constitute a second stage frequency acquisition loop 60 which may be a phase lock loop or a frequency lock loop. At the same time when the first stage resolution calibration is accomplished with acquirement of the first clock frequency, the PD 462 of the second stage frequency acquisition loop 60 is enabled by the second control signal to start performing the next calibration based on the first clock frequency outputted from the oscillator 42, and the loop filter 466 outputs the third control signal to set up a second frequency tuning range of the oscillator 42, different from the first frequency tuning range, until the variable clock frequency outputted from the oscillator 42 is tuned from the first clock frequency to reach the second clock frequency approaching the reference clock frequency. Then, the second frequency calibration device 46 fixes the variable clock frequency outputted from the oscillator 42 and tuned from the first clock frequency to be the second clock frequency. The first frequency tuning range is larger than the second frequency tuning range. It is because that firstly the first stage frequency acquisition loop 50 executes a coarsely tuning for the variable clock frequency outputted from the oscillator 42, and then the second stage frequency acquisition loop 60 executes a following finely tuning for the variable clock frequency that has been coarsely tuned. Therefore, an optimum frequency resolution can be achieved. Since the first frequency calibration device 40 and the second frequency calibration device 46 both share the same output frequency of the oscillator 42, the second stage frequency acquisition loop 60 can use an existing phase lock loop or frequency lock loop to lower cost.

Figure 7A:
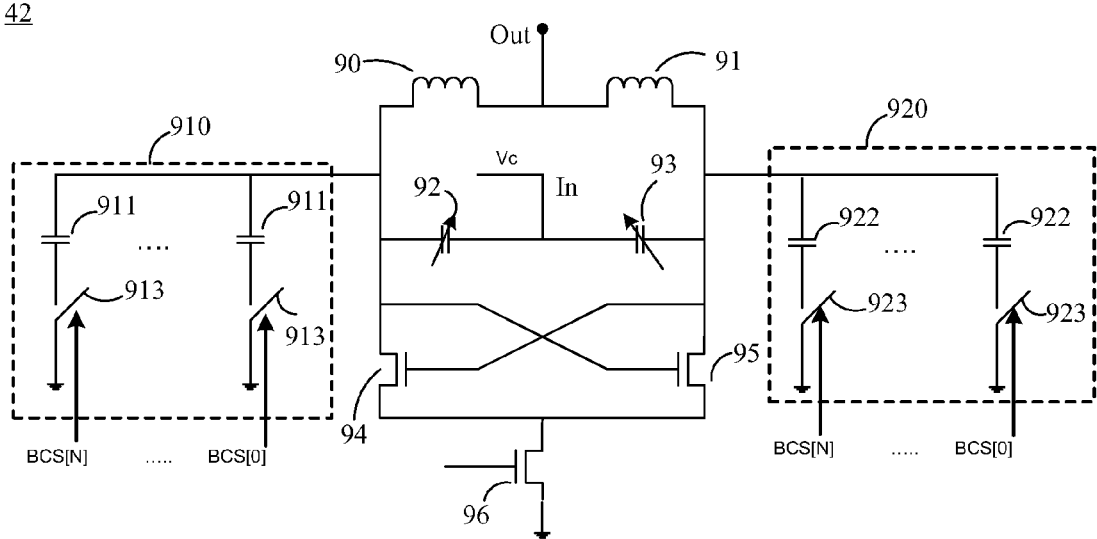
FIG. 7A is a functional block diagram showing an oscillator circuit of the serial bus clock frequency calibration system according to a preferred embodiment of the present invention.

Further referring to FIG. 4 and FIG. 7A, the oscillator 42 according to one embodiment of the present invention is presented herein, which may be an LC voltage-controlled oscillator (LC-VCO) including at least one output terminal (Out) configured to output variable clock frequency, a tuning terminal (In) configured to receive the third control signal (Vc), a pair of NMOS devices 94 and 95, a NMOS device 96, two inductances 90 and 91 respectively disposed at both sides of the output terminal (Out), two variable capacitors 92 and 93 and two capacitor banks 910 and 920. Due to differential characteristic of the LC oscillator, the capacitor bank 920 functions as the same as the other capacitor bank 910. The capacitor banks 910 and 920 are respectively connected to both opposite sides of the output terminal (Out) of the oscillator 42, and each of the capacitor banks 910 and 920 is composed of N+1 capacitors 911 and 922 with different or the same sizes. However, in other embodiments, the number of the capacitor banks of the oscillator 42 is not limited to two and more than one capacitor banks may be disposed at each side of the output terminal (Out) so as to increase different frequency tuning ranges. Furthermore, the size of each of the capacitor banks 910 and 920 may be designed to be binary weighted or unary weighted. Each of the capacitors 911 and 922 is connected to a switch 913, 923, each which may be implemented as a MOS device. Since a frequency tuning range provided by a common LC oscillator is very narrow, the presented invention utilizes the digital control signal to control the capacitor banks 910 and 920 so as to extend the first frequency tuning range of the LC oscillator 42 corresponding to variations of process, voltage and temperature. By the level variations of the digital switch signals BCS[0]~BCS[N] contained in the first control signal transmitted from the frequency error detector 408 of the first frequency calibration device 40, the switches 913 and 923 can be turned on or off so as to vary the variable clock frequency outputted from the oscillator 42. Accordingly, different frequency tuning ranges can be determined. Meanwhile, the two variable capacitors 92 and 93 are respectively connected to both sides of the tuning terminal (In) to vary the capacitances of the variable capacitors 92 and 93, according to the voltage magnitude of the third control signal (Vc) transmitted from the first frequency calibration device 40, so as to finely tune the variable clock frequency from the first clock frequency, outputted from the oscillator 42, and thereby provide a second frequency tuning range. The above-mentioned capacitor banks 910 and 920 and the variable capacitors 92 and 93 can be implemented with usage of various types of capacitors. For example, the capacitor banks 910 and 920 may be implemented with a metal-insulator-metal, (MIM) type capacitors, and the variable capacitors 92 and 93 may be implemented with a PMOS device, CMOS device or a plurality of smaller capacitors where the capacitance is consisted for subdividing the fine tuning.

It is generally understood that an ideal LC-VCO oscillates with $1/(2*\pi*\sqrt{(L*C)})$ frequency. However, due to the impedance of inductance or the loss of substrate, the energy stored in the inductance and the capacitor is easy to dissipate. This would result in stop of the oscillation. Therefore, the present invention provides a pair of intersectional-coupled NMOS devices 94 and 95 to supply energy, which functions as providing the inductance and the capacitor with negative impedance. The NMOS device 96 is configured with a predetermined current source.

Figure 7B:
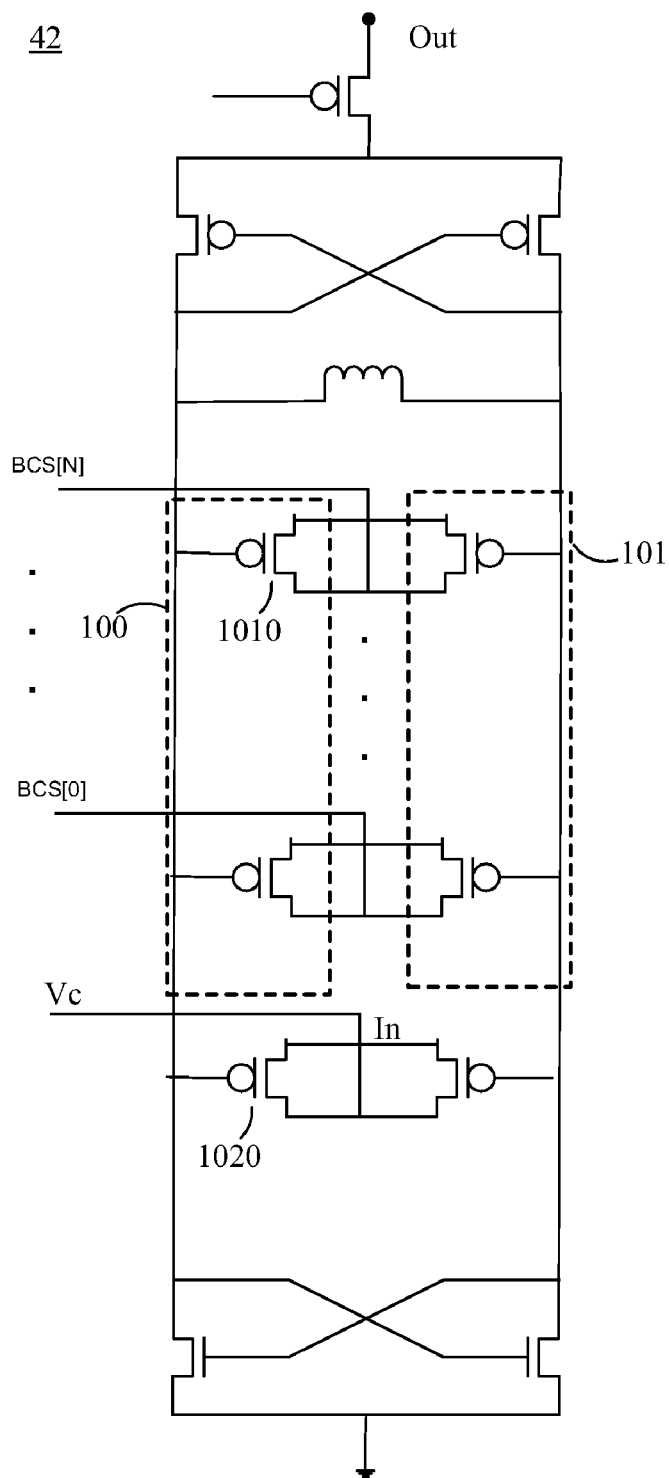
FIG. 7B is a functional block diagram showing an oscillator circuit of the serial bus clock frequency calibration system according to another preferred embodiment of the present invention.

Further referring to FIG. 4 and FIG. 7B, an oscillator 42 according to another embodiment of the present invention is presented herein, which is similar to the function and principle of the oscillator 42 illustrated in FIG. 7A, except that usages of the electrical devices Including, for example, each capacitor 1010 of one of the capacitor banks 100 and 101 which may be implemented with a PMOS device, and a variable capacitor 1020 connected to one side of the tuning terminal (In), which may also be implemented with a PMOS device.

Figure 8:
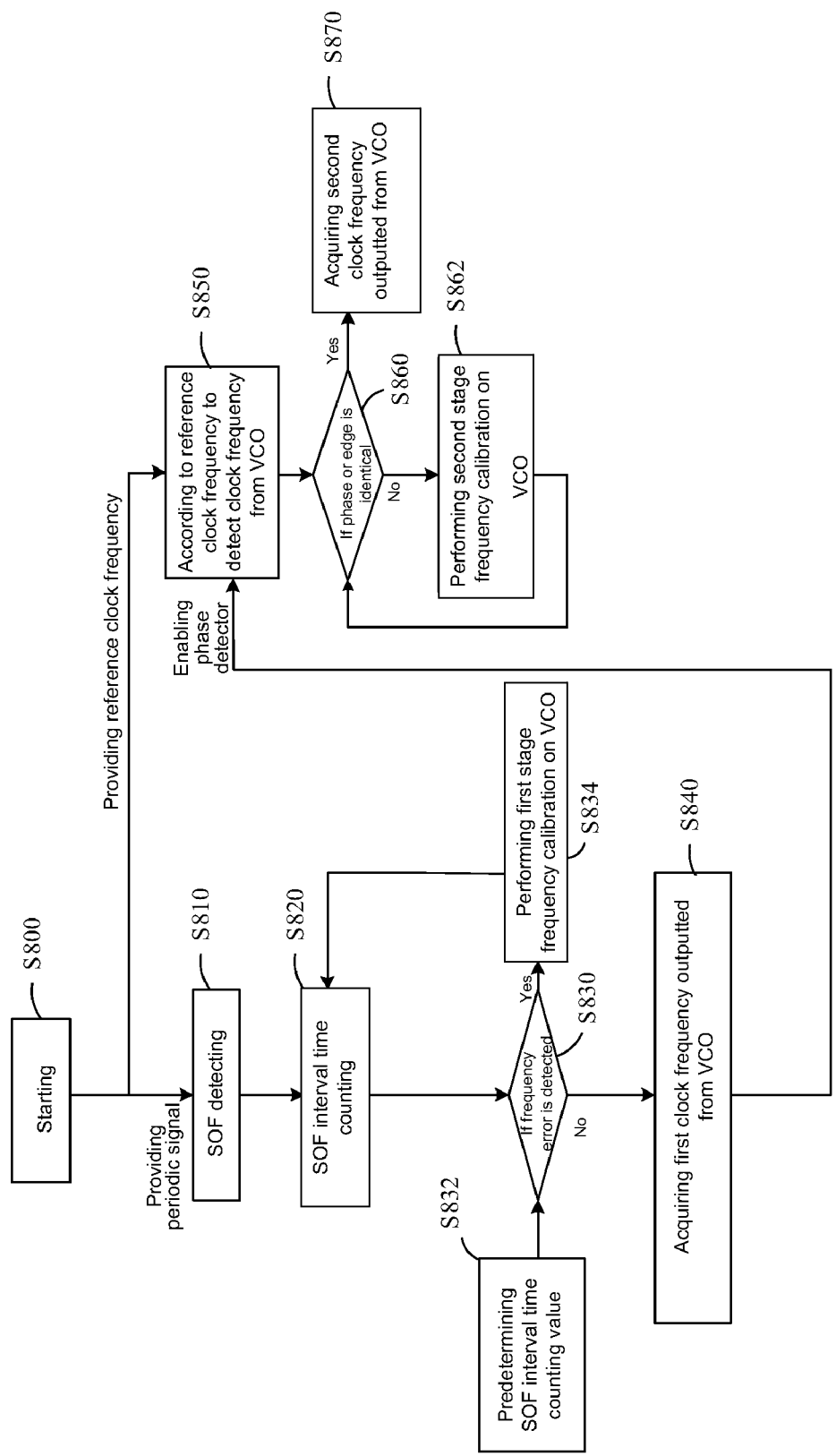
FIG. 8 is a flow diagram showing a serial bus clock frequency calibration method according to a preferred embodiment of the present invention.

Besides, referring to FIG. 8, a serial bus clock frequency calibration method according to the present invention is presented herein, with reference to the elements of the serial bus clock frequency calibration system shown in FIG. 4. The method comprises the following steps of:

Step S800, activating or reactivating the USB device to receive a USB input signal transmitted from the USB host, wherein the USB input signal provides at least a SOF periodic signal and a reference clock frequency;

Step S810, using the periodic signal detector of the first frequency calibration device to detect the SOF periodic signal of the USB input signal.

Step S820, using the interval counter of the first frequency calibration device to count the interval time of the SOF periodic signal, according to different variable clock frequency outputted from the oscillator so as to generate a working count value;

Step S830, using the frequency error detector of the first frequency calibration device to compare the working count value with a predetermined goal count value of SOF interval time in a step S832 to determine if there is a frequency error occurring and then generate a first control signal to the oscillator, according to the comparison result, and to generate a second control signal to the second frequency calibration device, wherein If a frequency error occurs, the step S834 is performed; and If the frequency error does not occur, the step S840 is performed;

Step S834, when the working count value is different to the predetermined goal count value, it means that the frequency error occurs, and the level of the first control signal is varied to set up a first stage frequency tuning range, and a the first stage frequency calibration is performed on the variable clock frequency of the oscillator, and the output level of the second control signal is fixed so as to disable the second frequency calibration device;

Step S840, when the working count value is identical to the predetermined goal count value, it means that the frequency error does not occur, and the variable clock frequency of the oscillator is tuned to reach a first clock frequency conforming with the interval time of the SOF periodic signal which is acquired by the oscillator, and the output level of the first control signal is fixed so as to maintain the variable clock frequency transmitted from the oscillator to be the first clock frequency, and the output level of the second control signal is varied simultaneously to enable the second frequency calibration device, wherein substantially the first frequency calibration device and the oscillator of the present invention constitute a first stage frequency acquisition loop to sets up a first frequency tuning range (as performing a frequency coarse tuning) of the oscillator, according to the first control signal, so as to modify the variable clock frequency outputted from the oscillator or maintain the variable clock frequency to be the first clock frequency. Therefore, if the variable clock frequency outputted from the oscillator does not conform with the interval time of the SOF periodic signal, the steps S820, S830 and S834 are performed repeatedly, until the first clock frequency is acquired and then sending the second control signal to enable the phase detector of the second frequency calibration device;

Step S850, the enabled phase detector according to the reference clock frequency detecting the variable clock frequency tuned from the first clock frequency outputted from VCO;

Step S860, using the phase detector to determine if the phase or edge difference between the reference clock frequency and the variable clock frequency outputted from the oscillator and tuned from the first clock frequency is identical, and then using the loop filter to generate a third control signal to the oscillator according to the determining result so as to modify the variable clock frequency from the first clock frequency, outputted from the oscillator, or maintain the variable clock frequency tuned from the first clock frequency to be a second clock frequency, wherein if the determining result is "no", the step S862 is performed. If the determining result is "yes", the step S870 is performed; and Step S862, varying the output level of the third control signal to set up different second frequency tuning range of the oscillator so as to modify the variable clock frequency from the first clock frequency outputted from the oscillator or maintain the variable clock frequency tuned from the first clock frequency to be the second clock frequency, as performing the second stage frequency calibration (a frequency fine tuning) from the first clock frequency outputted from the oscillator, and then transmitting the calibrated variable clock frequency back to the second frequency calibration device, wherein the first frequency tuning range is larger than the second frequency tuning range, and substantially, the second frequency calibration device and the oscillator of the present invention constitute a second stage frequency acquisition loop, which can be enabled by the second control signal to execute the second frequency tuning range according to the third control signal. Therefore, if the variable clock frequency outputted from the oscillator does not conform with the reference clock frequency, the steps S860 and S862 are performed repeatedly, until the second clock frequency conforming with the reference frequency is acquired by the oscillator shown in the step S870.

As described above, the serial bus clock frequency calibration system and the method thereof according to the present invention utilizes two-stage clock frequency resolution calibrations with different frequency tuning ranges for operating clock frequency of the USB device, wherein the two-stage calibrations includes one of which uses the SOF signal to be a preliminary reference for coarsely tuning the operating clock frequency of the USB device firstly; and the other of which then uses the USB input signal to be the reference clock frequency so as to continuously finely tune the operating clock frequency of the USB device, and thereby achieve optimum clock frequency resolution. In comparison, the Patent Pub. No. '154 has to additionally use a reference clock generating circuit (as a VCO) completely depending on detection of SOF signal to generate a reference clock frequency which is compared with a working clock frequency generated by another VCO of a frequency synthesizer, differently from that the serial bus clock frequency calibration system of the present invention directly treats the USB input signal frequency as a reference clock frequency which is compared with the working clock frequency generated from only the same VCO 42 shared by the first stage and second stage clock frequency calibrations, and thereby greatly reduces system complexity and save element cost. Besides, the Patent Pub. No. '154 has to continuously manipulate the reference clock generating circuit and the frequency synthesizer, regardless of within its each stage clock frequency calibration, so as to remain output of its calibrated frequency, differently from that the serial bus clock frequency calibration system of the present invention just starts to perform the second stage clock frequency calibration only after the phase detector 462 is enabled by the second control signal according to the accomplishment of the first stage clock frequency calibration and thereby can achieve greatly power saving.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A serial bus clock frequency calibration system for receiving a serial bus input signal transmitted from a serial bus host, which contains at least one periodic signal and a reference clock frequency, and the system comprising:
   an oscillator configured to generate a variable clock frequency;
   a first frequency calibration device according to the periodic signal and the variable clock frequency, generating a first control signal to the oscillator to continuously tune the variable clock frequency to reach a first clock frequency, and generating a second control signal; and
   a second frequency calibration device according to enabling of the second control signal and a phase or waveform edge of the reference clock frequency, generating a third control signal to the oscillator to continuously tune the variable clock frequency from the first clock frequency to reach a second clock frequency.

2. The serial bus clock frequency calibration system as claimed in claim 1, wherein the variable clock frequency conforms with an interval time of the periodic signal, the variable clock frequency is tuned to reach the first clock frequency.

3. The serial bus clock frequency calibration system as claimed in claim 1, wherein the variable clock frequency approaches the reference clock frequency, the variable clock frequency tuned from the first clock frequency reaches the second clock frequency.

4. The serial bus clock frequency calibration system as claimed in claim 1, wherein the serial bus host is a universal serial bus (USB) host, and the periodic signal is a start of frame (SOF) signal.

5. The serial bus clock frequency calibration system as claimed in claim 1, wherein the first frequency calibration device and the oscillator constitute a first stage frequency acquisition loop which sets up a first frequency tuning range of the oscillator according to the first control signal, and the second frequency calibration device and the oscillator simultaneously constitute a second stage frequency acquisition loop which sets up a second frequency tuning range of the oscillator according to the third control signal, and wherein the first frequency tuning range is larger than the second frequency tuning range.

6. The serial bus clock frequency calibration system as claimed in claim 2, wherein the first frequency calibration device includes:
   a periodic signal detector configured to detect the periodic signal;
   an interval counter configured to use the variable clock frequency transmitted from the oscillator to count the interval time of the periodic signal so as to generate a working count value; and
   a frequency error detector configured to generate the first control signal and the second control signal according to a comparison between the working count value and a predetermined goal count value.

7. The serial bus clock frequency calibration system as claimed in claim 6, wherein when the working count value is different to the predetermined goal count value, the frequency error detector varies an output level of the first control signal so as to vary the variable clock frequency.

8. The serial bus clock frequency calibration system as claimed in claim 6, wherein when the working count value is identical to the predetermined goal count value, the frequency error detector fixes an output level of the first control signal so as to maintain the variable clock frequency to be the first clock frequency, and simultaneously outputs the second control signal to enable the second frequency calibration device.

9. The serial bus clock frequency calibration system as claimed in claim 1, wherein the first control signal contains a plurality of variable switch signals.

10. The serial bus clock frequency calibration system as claimed in claim 9, wherein the oscillator includes a plurality of capacitor banks respectively disposed at both opposite sides of an output terminal, and each of capacitor banks is composed of a plurality of capacitors, and each of the capacitors is connected to a switch which is switched by the corresponding variable switch signal.

11. The serial bus clock frequency calibration system as claimed in claim 1, wherein the second frequency calibration device comprises:
    a phase detector enabled by the second control signal and according to a phase or edge difference between the reference clock frequency and the variable clock frequency tuned from the first clock frequency, generating at lest one indicator signal; and
    a loop filter according to the indicator signal, generating the third control signal to the oscillator.

12. The serial bus clock frequency calibration system as claimed in claim 10, wherein the third control signal is a voltage signal, and the oscillator is a voltage-controlled oscillator (VCO) and has a plurality of variable capacitors respectively connected to an input of the third control signal so as to provide the second frequency tuning range.

13. The serial bus clock frequency calibration system as claimed in claim 12, wherein the capacitors are PMOS devices or CMOS devices.

14. The serial bus clock frequency calibration system as claimed in claim 11, wherein the second frequency calibration device further comprises a frequency divider configured to receive the variable clock frequency tuned from the first clock frequency so as to generate a divided clock frequency to the phase detector.

15. The serial bus clock frequency calibration system as claimed in claim 11, wherein the second frequency calibration device further comprises a charge pump configured to generate a current to charge the loop filter.

16. A serial bus clock frequency calibration method comprising the following steps of:
    receiving a serial bus input signal transmitted from a serial bus host to a serial bus device, wherein the serial bus input signal contains at least one periodic signal and a reference clock frequency;
    using a first frequency calibration device, comparing whether an interval time of the periodic signal counted by a variable clock frequency generated from an oscillator is matched to generate a second control signal for tuning the variable clock frequency to reach a first clock frequency; and
    using a second frequency calibration device, according to a phase or edge difference between the reference clock frequency and the variable clock frequency tuned from the first clock frequency, generating a third control signal for tuning the variable clock frequency from the first clock frequency to reach a second clock frequency.

17. The serial bus clock frequency calibration method as claimed in claim 16, wherein when the variable clock frequency and the interval time of the periodic signal counted is matched, the turned variable clock frequency reaches the first clock frequency.

18. The serial bus clock frequency calibration method as claimed in claim 16, wherein when the variable clock frequency conforms with the reference clock frequency, the variable clock frequency turned from the first clock frequency reaches the second clock frequency.

19. The serial bus clock frequency calibration method as claimed in claim 16, further comprising the following steps of:
    using the first frequency calibration device and the oscillator to constitute a first stage frequency acquisition loop, and set up a first frequency tuning range of the oscillator to vary the variable clock frequency or maintain the variable clock frequency to be the first clock frequency according to the first control signal; and
    using the second frequency calibration device and the oscillator to constitute a second stage frequency acquisition loop which can be enabled by the second control signal, and set up a second frequency tuning range of the oscillator;
    wherein the first frequency tuning range is larger than the second frequency tuning range.

20. The serial bus clock frequency calibration method as claimed in claim 16, further comprising the following steps of:
    counting the interval time of the periodic signal so as to generate a working count value; and
    generating the first control signal and the second control signal, according to a comparison between the working count value and a predetermined goal count value;
    when the working count value is different to the predetermined goal count value, an output level of the first control signal is varied to tune the variable clock frequency; and
    when the working count value is identical to the predetermined goal count value, the output level of the first control signal is fixed to maintain the variable clock frequency to be the clock frequency, and the second control signal is outputted to enable the second frequency calibration device.

21. A serial bus clock frequency calibration method comprising the following steps of:
    receiving a serial bus input signal transmitted from a serial bus host to a serial bus device, which contains at least one periodic signal and a reference clock frequency;
    using a first frequency calibration device according to the periodic signal, performing a first stage resolution calibration on a variable clock frequency outputted from an oscillator until the variable clock frequency is calibrated to reach a first clock frequency conforming with the interval time of the periodic signal; and
    after accomplishment of the first stage resolution calibration, enabling a second frequency calibration device to continuously perform a second stage resolution calibration on the variable clock frequency from the first clock frequency until the variable clock frequency calibrated from the first clock frequency reaches a second clock frequency approaching the reference clock frequency.

22. The serial bus clock frequency calibration method as claimed in claim 21, wherein the first stage resolution calibration comprises the following step of: generating a first control signal to set up a first frequency tuning range of the oscillator so as to vary the variable clock frequency or maintain the variable clock frequency to be the first clock frequency, according to whether an interval time of the periodic signal counted by the variable clock frequency generated from the oscillator is matched.

23. The serial bus clock frequency calibration method as claimed in claim 22, further comprising the following step of: when the interval time of the periodic signal counted by the variable clock frequency generated from the oscillator is matched, the first stage resolution calibration is accomplished, and then the first frequency calibration device generates a second control signal to enable the second frequency calibration device.

24. The serial bus clock frequency calibration method as claimed in claim 23, wherein the second stage resolution calibration comprises the following step of: generating a third control signal to set up a second frequency tuning range of the oscillator, according to a phase or edge difference between the reference clock frequency and the variable clock frequency calibrated from the first clock frequency, so as to vary the variable clock frequency from the first clock frequency or maintain the calibrated variable clock frequency to be the second clock frequency, wherein the first frequency tuning range is larger than the second frequency tuning range.

* * * * *